US009871516B2

United States Patent
Jeong et al.

(10) Patent No.: US 9,871,516 B2
(45) Date of Patent: Jan. 16, 2018

(54) TRANSMITTING APPARATUS WITH SOURCE TERMINATION

(71) Applicant: Lattice Semiconductor Corporation, Portland, OR (US)

(72) Inventors: Youchul Jeong, Cupertino, CA (US); Junwoo Lee, Santa Clara, CA (US); Inyeol Lee, Saratoga, CA (US); Baegin Sung, Sunnyvale, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 0 days.

(21) Appl. No.: 14/296,377

(22) Filed: Jun. 4, 2014

(65) Prior Publication Data

US 2015/0358020 A1    Dec. 10, 2015

(51) Int. Cl.
*H03K 19/00*    (2006.01)
*H03K 19/003*    (2006.01)

(52) U.S. Cl.
CPC ... *H03K 19/0005* (2013.01); *H03K 19/00346* (2013.01)

(58) Field of Classification Search
CPC ............. H04L 25/0276; H04L 25/0278; H04L 25/0282; H04L 25/0274; H04L 25/0272; H04L 25/0292; H04L 25/085; H04M 11/06; H04B 3/30; H04B 15/02; H04B 1/58; H03K 19/018528; H01F 2017/0093; H03H 2001/0085; H03H 7/09; H03H 7/38
USPC ...................................... 326/21–34
See application file for complete search history.

(56) References Cited

U.S. PATENT DOCUMENTS

| 3,666,890 | A | 5/1972 | Wade |
| 6,205,182 | B1 | 3/2001 | Pardini et al. |
| 6,463,092 | B1 | 10/2002 | Kim et al. |
| 6,496,540 | B1 | 12/2002 | Widmer |
| 6,593,768 | B1 * | 7/2003 | Iyer .................... G06F 13/4086 326/30 |
| 6,731,751 | B1 | 5/2004 | Papadopoulos |
| 6,832,080 | B1 | 12/2004 | Arslan et al. |
| 6,914,597 | B2 | 7/2005 | Myers |

(Continued)

FOREIGN PATENT DOCUMENTS

| CN | 1574800 A | 2/2005 |
| CN | 101005292 A | 7/2007 |

(Continued)

*Primary Examiner* — Alexander H Taningco
*Assistant Examiner* — Seokjin Kim
(74) *Attorney, Agent, or Firm* — Fenwick & West LLP (57) ABSTRACT

In one embodiment, an apparatus for transmitting a signal with an improved termination is disclosed. The apparatus includes a driver to generate a differential mode signal superimposed on a common mode signal at a differential driver output of the driver. The differential driver output includes a first driver output and a second driver output. The apparatus also includes a termination circuit coupled between the first driver output and the second driver output. The termination circuit includes a capacitor connected to a node. The termination circuit also includes a first resistor and a first inductive element coupled in series between the first driver output and the node. In addition, the termination circuit includes a second resistor and a second inductive element coupled in series between the second driver output and the node.

18 Claims, 7 Drawing Sheets

(56) References Cited

U.S. PATENT DOCUMENTS

| | | |
|---|---|---|
| 7,020,208 B1 | 3/2006 | Yen |
| 7,085,950 B2 | 8/2006 | Ehmann et al. |
| 7,154,940 B2 | 12/2006 | Scott et al. |
| 7,339,502 B2 | 3/2008 | Furtner |
| 7,358,869 B1 | 4/2008 | Chiarulli et al. |
| 7,408,993 B2 | 8/2008 | Webster |
| 7,436,203 B1* | 10/2008 | Hidri et al. .................. 326/30 |
| 7,443,211 B2* | 10/2008 | Liu .................. H03K 5/1534 326/30 |
| 7,490,209 B1 | 2/2009 | Charagulla |
| 7,565,576 B2 | 7/2009 | Seroff |
| 7,627,044 B2 | 12/2009 | Kim et al. |
| 7,836,363 B2 | 11/2010 | Quinlan et al. |
| 7,844,762 B2 | 11/2010 | Banks et al. |
| 7,952,538 B2 | 5/2011 | Han et al. |
| 8,090,030 B2 | 1/2012 | Kim et al. |
| 8,108,576 B2 | 1/2012 | Shen et al. |
| 8,176,214 B2 | 5/2012 | Jones et al. |
| 8,416,852 B2 | 4/2013 | Matsubayashi |
| 8,589,998 B2 | 11/2013 | Wu et al. |
| 8,644,334 B2 | 2/2014 | Altmann |
| 8,692,937 B2 | 4/2014 | Altmann |
| 8,804,853 B2 | 8/2014 | Hsueh |
| 2002/0008263 A1 | 1/2002 | Hirano et al. |
| 2002/0044147 A1 | 4/2002 | Martin |
| 2002/0149541 A1 | 10/2002 | Shin |
| 2002/0184552 A1 | 12/2002 | Evoy et al. |
| 2003/0069042 A1 | 4/2003 | Sato et al. |
| 2003/0131310 A1 | 7/2003 | Pitio |
| 2003/0145258 A1 | 7/2003 | Warner et al. |
| 2003/0201802 A1 | 10/2003 | Young |
| 2003/0208779 A1 | 11/2003 | Green et al. |
| 2004/0036494 A1 | 2/2004 | Mak et al. |
| 2004/0239374 A1 | 12/2004 | Hori |
| 2004/0240580 A1 | 12/2004 | Bessios et al. |
| 2005/0044257 A1 | 2/2005 | Booth et al. |
| 2005/0280405 A1 | 12/2005 | Bray |
| 2006/0044061 A1 | 3/2006 | Mukherjee et al. |
| 2006/0114046 A1 | 6/2006 | Mizutani |
| 2006/0126751 A1 | 6/2006 | Bessios |
| 2007/0024369 A1* | 2/2007 | Cao .................. H03F 3/195 330/269 |
| 2007/0057830 A1 | 3/2007 | Wiesbauer et al. |
| 2007/0146011 A1 | 6/2007 | O'Mahony et al. |
| 2007/0200859 A1 | 8/2007 | Banks et al. |
| 2008/0022023 A1 | 1/2008 | Kim et al. |
| 2008/0037693 A1 | 2/2008 | Andrus et al. |
| 2008/0063129 A1 | 3/2008 | Voutilainen |
| 2008/0116943 A1* | 5/2008 | Nair .................. H03K 19/01852 327/108 |
| 2008/0174383 A1* | 7/2008 | Zolomy .................. H03H 7/38 333/32 |
| 2008/0285634 A1 | 11/2008 | Raghavan et al. |
| 2008/0310521 A1 | 12/2008 | Otsuka et al. |
| 2008/0315920 A1 | 12/2008 | Hung et al. |
| 2009/0168918 A1 | 7/2009 | Chen et al. |
| 2009/0252206 A1 | 10/2009 | Rheinfelder et al. |
| 2010/0013579 A1 | 1/2010 | Horan et al. |
| 2010/0054738 A1 | 3/2010 | Yuki |
| 2010/0067877 A1 | 3/2010 | Ichimura et al. |
| 2010/0104029 A1 | 4/2010 | Lee et al. |
| 2010/0138887 A1 | 6/2010 | Nakata |
| 2010/0215118 A1 | 8/2010 | Ware et al. |
| 2010/0232484 A1 | 9/2010 | Chiu |
| 2010/0272215 A1 | 10/2010 | Lin et al. |
| 2010/0329381 A1 | 12/2010 | Shimizu et al. |
| 2011/0196997 A1 | 8/2011 | Ruberg et al. |
| 2012/0008263 A1 | 1/2012 | Sugita |
| 2012/0082249 A1 | 4/2012 | Hsueh |
| 2012/0098960 A1 | 4/2012 | Fujino et al. |
| 2012/0106949 A1 | 5/2012 | Tang et al. |
| 2012/0155398 A1 | 6/2012 | Oyman et al. |
| 2012/0229310 A1 | 9/2012 | Chang |
| 2013/0015821 A1 | 1/2013 | Kim et al. |
| 2013/0089110 A1 | 4/2013 | Sharma et al. |
| 2013/0151875 A1 | 6/2013 | Huynh |
| 2013/0223293 A1 | 8/2013 | Jones et al. |
| 2014/0198418 A1* | 7/2014 | Wang .................. H01L 28/10 361/56 |
| 2014/0241457 A1 | 8/2014 | Kim et al. |
| 2015/0049839 A1* | 2/2015 | Lee .................. H04L 25/085 375/296 |
| 2015/0188697 A1* | 7/2015 | Lin .................. H03L 7/085 375/375 |
| 2015/0326638 A1* | 11/2015 | Yarygin .................. H04L 65/602 709/219 |

FOREIGN PATENT DOCUMENTS

| | | |
|---|---|---|
| CN | 101542992 A | 9/2009 |
| EP | 1241844 | 9/2002 |
| JP | 2004-520778 A | 9/2002 |
| WO | WO 2007/060620 A1 | 5/2007 |

* cited by examiner

TRANSMITTING APPARATUS WITH SOURCE TERMINATION

BACKGROUND

1. Field of the Disclosure

This disclosure pertains in general to data communications, and more specifically to signal integrity on a chip to chip communication.

2. Description of the Related Art

Video and audio data are typically transferred from one device to another across using communication links. In an advanced protocol such as the high definition multimedia interface (HDMI) or the mobile high definition link (MHL), one device may communicate with another using a common mode signal superimposed on a differential mode signal. The common mode signal may generate Electromagnetic Interference (EMI). To suppress the EMI and properly terminate the output of a transmitting device, a common mode choke may be employed between the two devices. However, the common mode choke may degrade the signal quality from the transmitting device.

SUMMARY

Embodiments of the present disclosure relate to a transmitting apparatus with an improved source termination for a chip to chip communication in a manner that properly terminates an output of the transmitter, maintains the signal quality, and reduces EMI.

In one embodiment, an apparatus for transmitting a signal with an improved termination is disclosed. The apparatus includes a driver to generate a differential mode signal superimposed on a common mode signal at a differential driver output of the driver. The differential driver output includes a first driver output and a second driver output. The apparatus also includes a termination circuit coupled between the first driver output and the second driver output. The termination circuit includes a capacitor connected to a node. The termination circuit also includes a first resistor and a first inductive element coupled in series between the first driver output and the node. In addition, the termination circuit includes a second resistor and a second inductive element coupled in series between the second driver output and the node. The first inductive element and second inductive element causes peaking in the differential mode signal at the differential driver output.

In one embodiment, the apparatus further includes a first switch coupled in series with the first resistor and the first inductive element between the first driver output and the node. The apparatus also includes a second switch coupled in series with the second resistor and the second inductive element between the second driver output and the node.

In one embodiment, the first switch and second switch are closed when the apparatus is communicating through a first communication protocol. The first switch and the second switch are open when the apparatus is communicating through a second communication protocol.

BRIEF DESCRIPTION OF THE DRAWINGS

The teachings of the embodiments disclosed herein can be readily understood by considering the following detailed description in conjunction with the accompanying drawings.

DETAILED DESCRIPTION

The Figures (FIG.) and the following description relate to various embodiments by way of illustration only. It should be noted that from the following discussion, alternative embodiments of the structures and methods disclosed herein will be readily recognized as viable alternatives that may be employed without departing from the principles discussed herein. Reference will now be made in detail to several embodiments, examples of which are illustrated in the accompanying figures. It is noted that wherever practicable similar or like reference numbers may be used in the figures and may indicate similar or like functionality.

As used herein, the term directly connected means that two components are directly connected to each other without any intervening components. The term coupled means that two components may be directly connected to each other or that intervening components may be located between two components.

Embodiments of the present disclosure include a transmitter with a termination circuit that does not degrade signal quality. The transmitter communicates with a receiver through a differential signal including a differential mode signal and a common mode signal. The termination circuit ensures signal integrity of signals produced from the transmitter in a chip to chip communication. In addition, the termination circuit enables a proper termination to reduce unwanted interference from one device to another.

Figure 1:
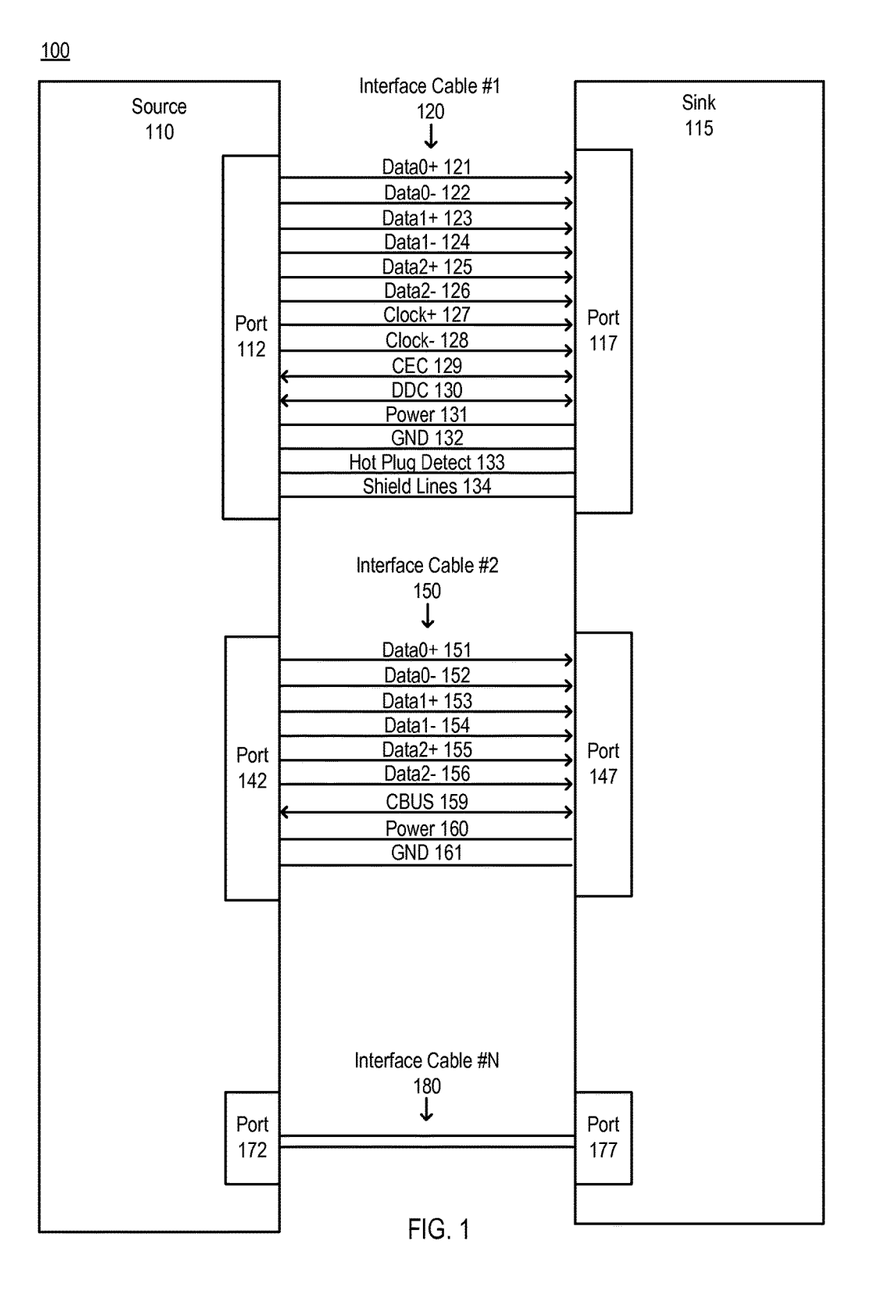
FIG. 1 is a high-level block diagram of a system for multimedia data communications, according to one embodiment.

FIG. 1 is a high-level block diagram of a system 100 for data communications, according to one embodiment. The system 100 includes a source device 110 communicating with a sink device 115 through one or more communication media (e.g., one or more interface cables 120, 150, 180).

Source device 110 transmits multimedia data streams (e.g., audio/video streams) to the sink device 115 and also exchanges control data with the sink device 115 through the interface cables 120, 150, 180. In one embodiment, source device 110 and/or sink device 115 may be repeater devices.

Source device 110 includes physical communication ports 112, 142, 172 for coupling to the interface cables 120, 150, 180. Sink device 115 also includes physical communication ports 117, 147, 177 for coupling to the interface cables 120, 150, 180. Signals exchanged between the source device 110 and the sink device 115 across the interface cables 120, 150, 180 pass through the physical communication ports.

Source device 110 and sink device 115 exchange data using various protocols. In one embodiment, interface cable 150 represents a Mobile High-Definition Link (MHL) cable. The MHL cable 150 supports differential signals transmitted via data0+ line 151, data0− line 152, data1+ line 153, data1− line 154, data2+ line 155 and data2− line 156. In some embodiments of MHL, there may only be a single pair of differential data lines (e.g., 151 and 152). Embedded common mode clocks are transmitted through the differential data lines. The MHL cable 150 may further include a control bus (CBUS) 159, power 160 and ground 161. The CBUS 159 carries control information such as discovery data, configuration data and remote control commands.

In one embodiment, interface cable 120 represents a High Definition Multimedia Interface (HDMI) cable. The HDMI cable 120 supports differential signals transmitted via data0+ line 121, data0− line 122, data1+ line 123, data1− line 124, data2+ line 125, and data2− line 126. The HDMI cable 120 may further include differential clock lines clock+ 127 and clock− 128; Consumer Electronics Control (CEC) control bus 129; Display Data Channel (DDC) bus 130; power 131, ground 132; hot plug detect 133; and four shield lines 134 for the differential signals. In some embodiments, the sink device 115 may utilize the CEC control bus 129 for the transmission of closed loop feedback control data to source device 110.

In one embodiment, a representation of the source device 110, the sink device 115, or components within the source device 110 or sink device 115 may be stored as data in a non-transitory computer-readable medium (e.g. hard disk drive, flash drive, optical drive). These representations may be behavioral level, register transfer level, logic component level, transistor level and layout geometry-level descriptions.

Figure 2A:
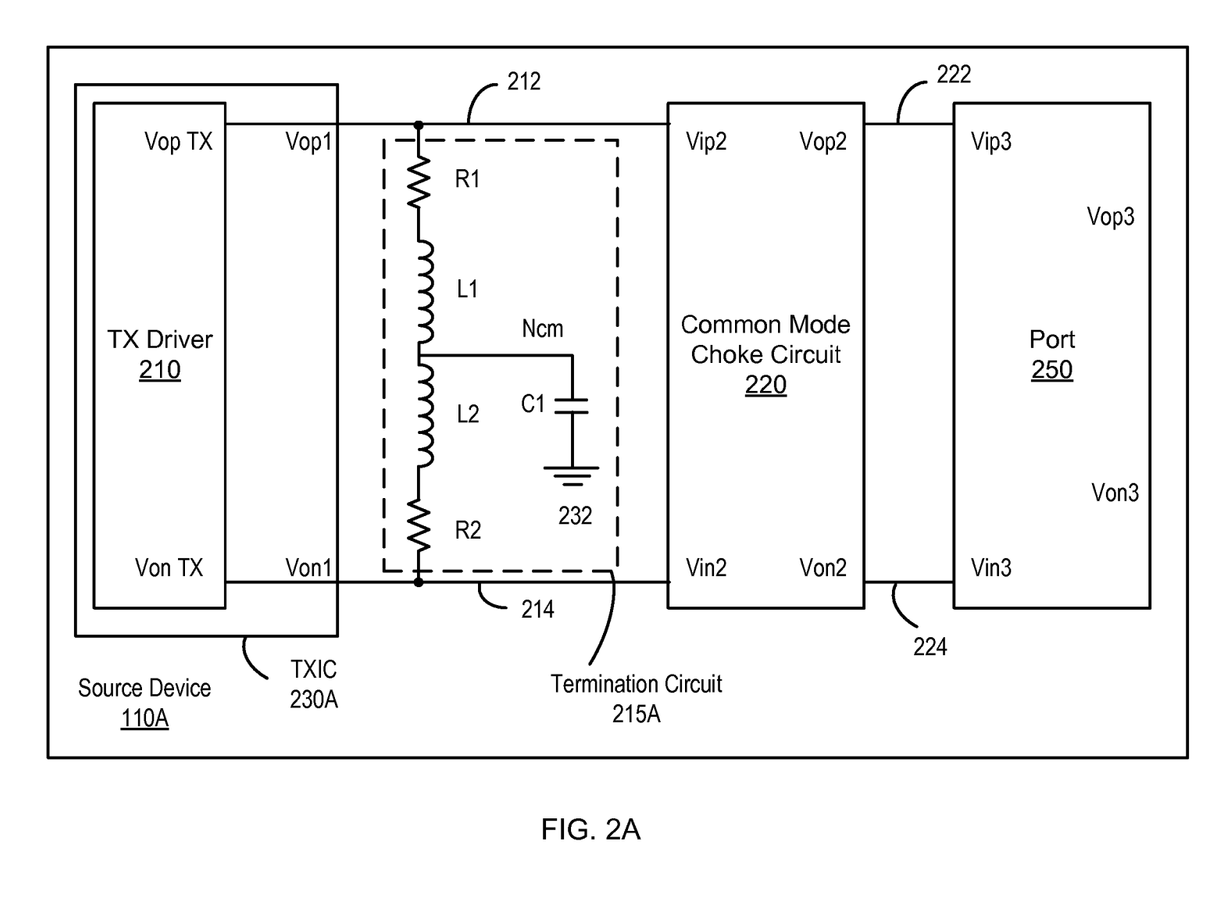
FIG. 2A is a block diagram of a source device, according to one embodiment.

FIG. 2A is a block diagram of a source device 110A, according to one embodiment. The source device 110A includes a transmitter integrated circuit (TXIC) 230A, a termination circuit 215A, a common mode choke circuit 220 and a port 250. A positive output pin Vop1 of the TXIC 230A is coupled to a positive input pin Vip2 of the common mode choke circuit 220 via a connection 212. In addition, a negative output pin Von1 of the TXIC 230A is coupled to the negative input pin Vin2 of the common mode choke circuit 220 via a connection 214. The termination circuit 215A is coupled between the positive output pin Vop1 and the negative output pin Von1 of the TXIC 230A. In addition, a positive output pin Vop2 of the common mode choke circuit 220 is coupled to a positive input pin Vip3 of the port 250 via a connection 222. Moreover, a negative output pin Von2 of the common mode choke circuit 220 is coupled to a negative input pin Vin3 of the port 250 via a connection 224. Together these circuits form a source device 110A that complies with EMI regulations and maintains good signal quality.

The TXIC 230A includes a transmitter driver (TX driver) 210 that drives a differential signal onto the driver outputs Vop and Von that includes a differential mode signal and a common mode signal. The differential mode signal typically operates at a higher frequency than the common mode signal. In one embodiment that uses MHL, the differential mode signal operates at 3 GHz and represents data for a multimedia stream. The common mode signal is a clock that operates at 75 MHz. In another embodiment that uses HDMI, the differential mode signal can represent one data stream (e.g. Ethernet data) while the common mode signal represents another data stream (e.g. audio data). In one embodiment, the TX driver 210 includes a differential driver to generate the differential mode signal and a common mode driver to generate the common mode signal. A positive output pin Vop TX of the TX driver 210 is coupled to the positive output pin Vop1 of the TXIC 230A to transmit a positive signal of the differential signal. Similarly, a negative output pin Von TX of the TX driver 210 is coupled to the negative output pin Von1 of the TXIC 230A to transmit a negative signal of the differential signal.

As illustrated in FIG. 2A, the common mode choke circuit 220 is coupled between the differential outputs Vop1 and Von1 of the TX driver 210. The common mode choke circuit 220 suppresses common mode noise generated from the TXIC 230A. In one embodiment, the common mode choke circuit 220 is formed with a transformer. The transformer may be configured such that magnetic fluxes generated from the common mode signal by the TX driver 210 are added together. Hence, the common mode choke circuit 220 acts as an inductor to suppress the common mode noise at a high frequency and passes the common mode signal at a low frequency. The transformer is also configured such that magnetic fluxes generated from the differential signal by the TX driver 210 are cancelled with each other. Hence, the common mode choke circuit 220 passes the differential mode signal without substantial loss.

In one embodiment, the port 250 provides a physical interface to mate with an interface cable 120 as described herein with respect to FIG. 1. For a HDMI protocol, the port 250 may be the port 112 of FIG. 1. For a MHL protocol, the port 250 may be the port 142 of FIG. 1.

In one embodiment, an electrostatic discharge (ESD) protection circuit (not shown) may be implemented between the common mode choke circuit 220 and the port 250 to alleviate a sudden flow of electricity between the TXIC 230A and the port 250.

The termination circuit 215A enables a proper termination to guarantee adequate signal quality and reduce the EMI from the TXIC 230A. In one embodiment, the termination circuit 215A includes passive components such as a first resistor R1, a second resistor R2, a first inductor L1, a second inductor L2 and a capacitor C1. In the source device 110A, the passive components are implemented external to the TXIC 230A on a printed circuit board (PCB).

In one embodiment, the first resistor R1 and the first inductor L1 are coupled in series between the positive output pin Vop1 of the TXIC 230A and a common node Ncm. For example, one end of the first resistor R1 is coupled to the positive output pin Vop1, and another end of the first resistor R1 is coupled to one end of the first inductor L1. Additionally, another end of the first inductor L1 is coupled to the common node Ncm. Alternatively, the first resistor R1 and the inductor L1 may be swapped. In addition, the second resistor R2 and the second inductor L2 are coupled in series between the negative output Von1 of the TXIC 230A and the common node Ncm. The configuration of the second resistor R2, the second inductor L2, and the negative output pin Von1 are substantially similar to the configuration of the first resistor R1, the first inductor L1, and the positive output pin Vop1. Additionally, a capacitor C1 is coupled between the common node Ncm and ground 232 to suppress a common mode peaking in the common mode signal.

In this configuration, the first resistor R1 and the second resistor R2 provide a termination impedance to the common mode signal. The capacitor C1 removes an unwanted peaking of the common mode signal generated due to the common mode choke circuit 220 as described in details herein with respect to FIG. 4A.

Figure 2B:
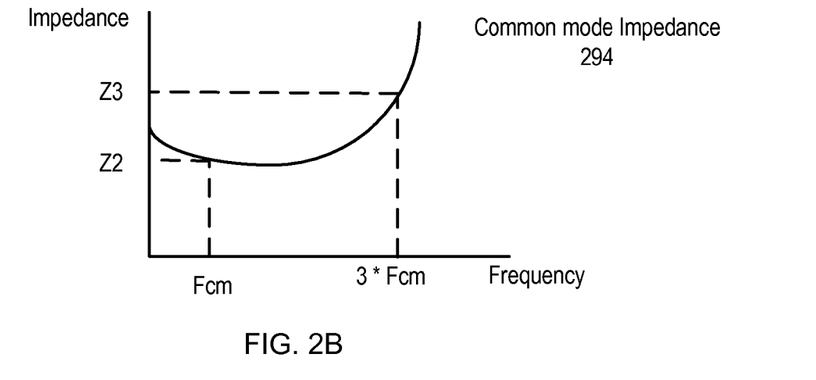
FIG. 2B is an impedance plot of a termination circuit for a common mode signal versus frequency.

Referring to FIG. 2B, illustrated is an impedance plot of a termination circuit for the common mode signal versus frequency, according to one embodiment. As illustrated in FIG. 2B, the common mode impedance 294 of the termination circuit 215A becomes Z2 (e.g., approximately 50 Ohm) at the common mode operating frequency fcm, because both the inductive elements L1 and L2 become substantially shorted. The common mode impedance 294 increases as the frequency increases, because the impedance of each of the inductive elements L1 and L2 increases. For example, values for the inductive elements L1 and L2 can be chosen such that at three times the frequency of the common mode operating frequency fcm, the common mode impedance 294 becomes Z3 (e.g., approximately 100 Ohm). The value for the capacitor C1 is chosen such that the capacitor C1 does not introduce a significant impedance at the common mode operating frequency fcm.

In one embodiment, the value for capacitor C1 can be selected to obtain a common mode impedance 294 with the following equation:

$$C1 > \frac{1}{2 \times \pi \times fcm \times 0.1 \text{ Ohm}}. \tag{eq1}$$

In equation 1, impedance of 0.1 Ohm is targeted to ensure that the common node Ncm is substantially close to ground at a common mode operating frequency fcm. As the capacitance of the capacitor C1 becomes larger, the common node Ncm becomes closer to ground.

Without inductors L1 and L2, the resistors R1, R2 and capacitor C1 would have the negative side effect of reducing the size of the data eye for the differential mode signal. To address this problem, the first inductor L1 and the second inductor L2 are placed in series with the resistors R1 and R2. The first inductor L1 and second inductor L2 present high impedance to the differential mode signal and generate a differential mode peaking, as described in details with respect to FIG. 4B. For the differential mode signal, the common node Ncm becomes virtual ground, therefore the capacitor C1 becomes ineffective.

The inductive values for L1 and L2 can be selected to obtain the common mode impedance 294 with the following equation:

$$L < \frac{R}{2 \times \pi \times fcm \times 3}. \tag{eq2}$$

Figure 2C:
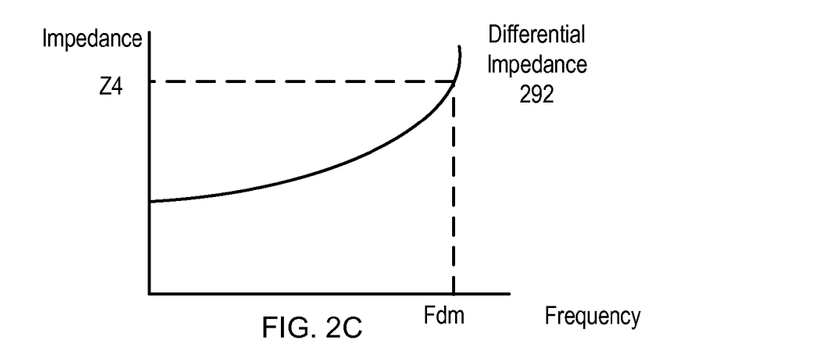
FIG. 2C is an impedance plot of a termination circuit for a differential mode signal versus frequency, according to one embodiment.

In equation 2, each of the resistance of the resistors R1 and R2 is targeted for the impedance of each of the inductive elements L1 and L2 to ensure that the inductive elements L1 and L2 do not increase the common mode impedance 294 at the third harmonic of the common mode operating frequency fcm. The inductance of each of the inductive elements L1 and L2 are chosen such that the inductive elements L1 and L2 add substantially no impedance to the common mode impedance 294 at the third harmonic of the common mode operating frequency fcm. Moreover, the inductance of each of the inductive elements L1 and L2 are chosen such that the inductive elements L1 and L2 add a large impedance to the differential impedance 292 at the differential mode operating frequency Fdm.

Figure 2D:
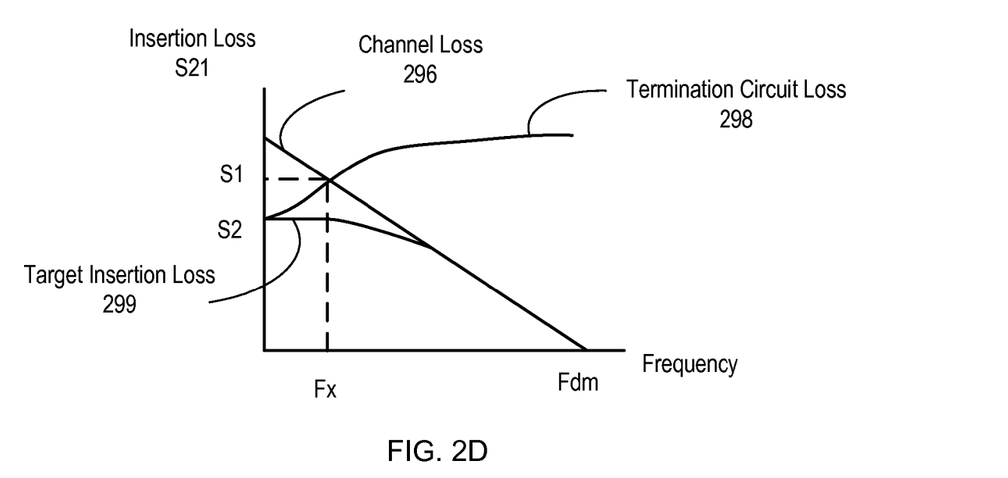
FIG. 2D is an insertion loss plot of a termination circuit for a differential mode signal versus frequency, according to one embodiment.

As illustrated in FIG. 2C, the differential impedance 292 of the termination circuit 215A becomes Z4 (e.g., 1500 Ohm) at the differential mode operating frequency Fdm, because each of the inductive elements L1 and L2 contributes large impedance. In this configuration, the termination circuit 215A presents high impedance to a differential mode signal to improve an eye opening (i.e., signal quality) at the differential mode operating frequency Fdm, as described herein in detail with respect to FIG. 4B. In one embodiment, R1 is 50 Ohm, R2 is 50 Ohm, L1 is 20 nH, L2 is 20 nH, and C1 is 100 nF FIG. 2D illustrates an insertion loss S21 plot of the differential mode signal in the termination circuit 215A, according to one embodiment. The plot in FIG. 2D includes a channel loss plot 296, a termination circuit loss plot 298, and a target insertion loss plot 299. Together, these plots illustrate one example aspect of determining values of the inductive elements L1 and L2 in the termination circuit 215A.

In one approach, the values of the inductive elements L1 and L2 are determined such that the target insertion loss plot 299 retains approximately a flat region below a frequency fx. The frequency fx is determined by when the insertion loss S21 of a channel without the termination circuit 215A is close to S1. The channel loss plot 296 approximates a resistive loss due to the connections 212, 222, 214 and 224 to the port 250. The insertion loss S21 of the channel drops in a substantially linear manner as depicted by the channel loss plot 296. For example, if the channel loss plot 296 at the differential mode operating frequency Fdm is −10 dB, the frequency fx (e.g., ~600 MHz) can be determined such that the channel loss plot 296 is approximately −1.78 dB.

An insertion loss S21 of the termination circuit 215A improves as illustrated in the termination circuit loss plot 298, because the termination circuit 215A includes the inductive elements L1 and L2, and the resistors R1 and R2. In one aspect, the values of the resistors R1 and R2 are predetermined (e.g., 50 Ohm each). Therefore, the values of the inductive elements L1 and L2 can be chosen such that the insertion loss S21 of the termination circuit loss plot 298 is close to S1 at the frequency fx.

The target insertion loss plot 299 is an insertion loss S21 of the channel including the termination circuit 215A. Therefore, the channel loss plot 296 is combined with the termination circuit loss plot 298 to produce the target insertion loss plot 299 as in FIG. 2D. Hence, the target insertion loss plot 299 becomes substantially flat below the frequency fx. Below the frequency fx, the summation of the channel loss plot 296 and the termination circuit loss plot 298 becomes S2. For example, S2 is substantially equal to −3.52 dB, or between −3 dB and −4 dB. In addition, the target insertion loss plot 299 tracks the channel loss plot 296 above the frequency fx, because the channel loss dominates the total loss in this region.

In one approach, assuming the resistance of each of the resistors R1 and R2 is 50 ohm, the inductance of each of the inductive elements L1 and L2 can be determined using the following equation:

$$L = \frac{1}{4 \times \pi \times fx} \sqrt{\frac{x^2(150)^2 - (100)^2}{1-x^2}}, \quad (eq3)$$

where x is an insertion loss S21 of the termination circuit 215A at the frequency fx. For example, an insertion loss x corresponding to −1.78 dB at the frequency fx of 600 MHz leads to a L value of approximately 16.63 nH.

Figure 3:
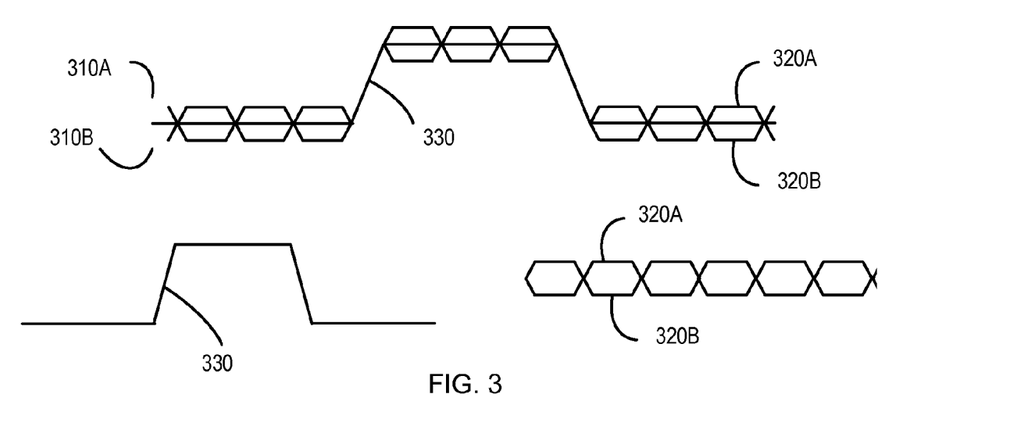
FIG. 3 is an illustration of a signal transmitted from the source device including a differential mode signal and a common mode signal, according to one embodiment.

Turning to FIG. 3, illustrated is a positive signal 310A and a negative signal 310B of the differential signal (collectively herein referred to as a differential signal 310) transmitted from the positive output pin Vop1 and the negative output Von1 of the TXIC 230A respectively. As illustrated, the differential signal 310 includes a common mode signal 330 superimposed on a differential mode positive signal 320A and a differential mode negative signal 320B (generally herein referred to as a differential mode signal 320). The common mode signal 330 is obtained by averaging the positive signal 310A and the negative signal 310B of the differential signal 310. The differential mode signal 320 is obtained by comparing the positive signal 310A to the negative signal 310B. As illustrated in FIG. 3, a frequency of the differential mode signal 320 is higher than a frequency of the common mode signal 330.

Figure 4A:
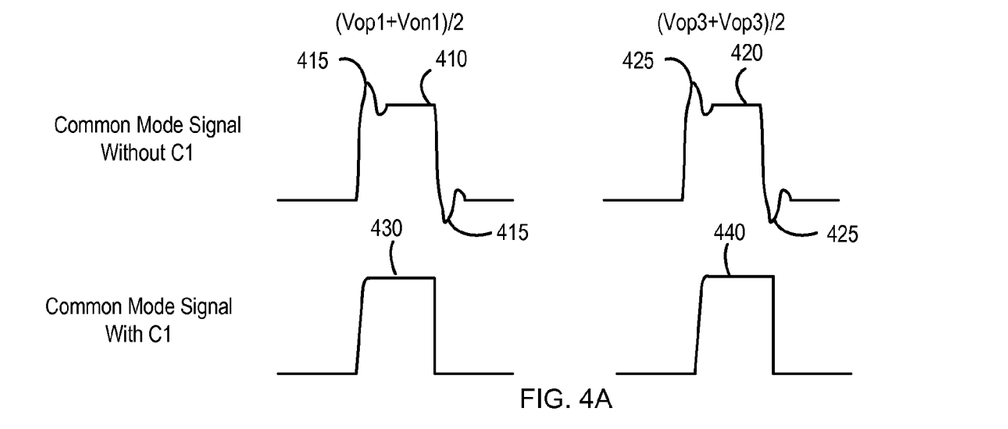
FIGS. 4A and 4B are illustrations of common mode and differential mode signals with various termination configurations at an output of a driver and an output of a port, according to one embodiment.

FIG. 4A is an illustration of the common mode signal 330 with various termination configurations at the output pins Vop1 and Von1 of the TXIC 230A and the output pins Vop3 and Von3 of the port 250. In case a capacitor C1 is omitted from the termination circuit 215A, a common mode signal 410 at the output pins Vop1 and Von1 of the TXIC 230A includes a peaking 415, because the common mode choke circuit 220 fails to respond to a very sharp transition (e.g., 1 ns). The peaking 415 of the common mode signal 410 introduces an undesired EMI. A common mode signal 420 at the output pins Vop3 and Von3 of the port 250 is substantially similar to the common mode signal 410 at the output pins Vop1 and Von1 of the TXIC 230A, because the common mode signal 410 operates at a relatively low frequency (e.g., 75 MHz).

Implementing the capacitor C1 alleviates the peaking 415 in a common mode signal 430 at the output pins Vop1 and Von1 of the TXIC 230A. Hence, the common mode signal 430 at the output pins Vop1 and Von1 of the TXIC 230A becomes substantially similar to a square wave. Similarly, the peaking 425 in the common mode signal 440 at the output pins Vop3 and Von3 of the port 250 is alleviated.

Figure 4B:
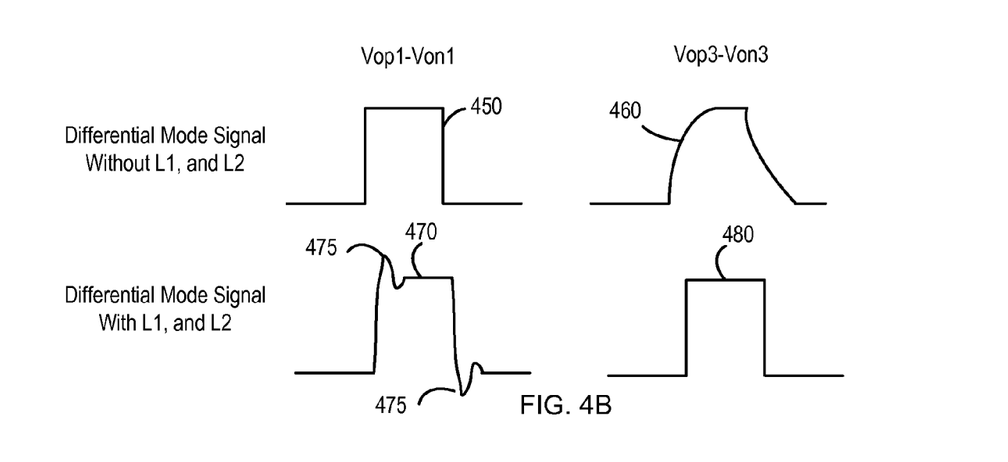

FIG. 4B is an illustration of the differential mode signal 320 with various termination configurations at the output pins Vop1 and Von1 of the TXIC 230A and the output pins Vop3 and Von3 of the port 250. As illustrated in FIG. 4B, a differential mode signal 450 at the output pins Vop1 and Von1 of the TXIC 230A is substantially close to a square wave. However, without the first inductor L1 and the second inductor L2 from the termination circuit 215A, the differential mode signal 460 at the output pins Vop3 and Von3 of the port 250 is damped, because the differential mode signal 450 operates at a high frequency (e.g., 3 GHz). As a result, parasitic capacitances associated with the common mode choke circuit 220, port 250 and connections 212, 222, 214 and 224 become significant and slow the response at the output pins Vop3 and Von3 of the port 250. Damping of the differential mode signal 460 reduces the data eye of the differential mode signal at the sink device 115.

Implementing the first inductor L1 and the second inductor L2 introduces a peaking 475 in a differential mode signal 470 at the output pins Vop1 and Von1 of the TXIC 230A. The peaking 475 causes the rising edge of the differential mode signal 470 to temporarily rise past a target differential voltage (for logic value 1) of the differential mode signal 470 before settling at the target differential voltage. The peaking 475 causes the falling edge of the differential mode signal 470 to temporarily fall below a target differential voltage (for logic value 0) of the differential mode signal 470 before settling at the target differential voltage. The peaking 475 in the differential mode signal 470 does not cause EMI issues, because the magnetic field caused by the peaking 475 is cancelled out. The differential mode signal 480 at the output pins Vop3 and Von3 of the port 250 substantially similar to a square wave. The change in shape of the differential mode signal 480 is due to parasitic capacitances within the source device 110A.

Figure 5:
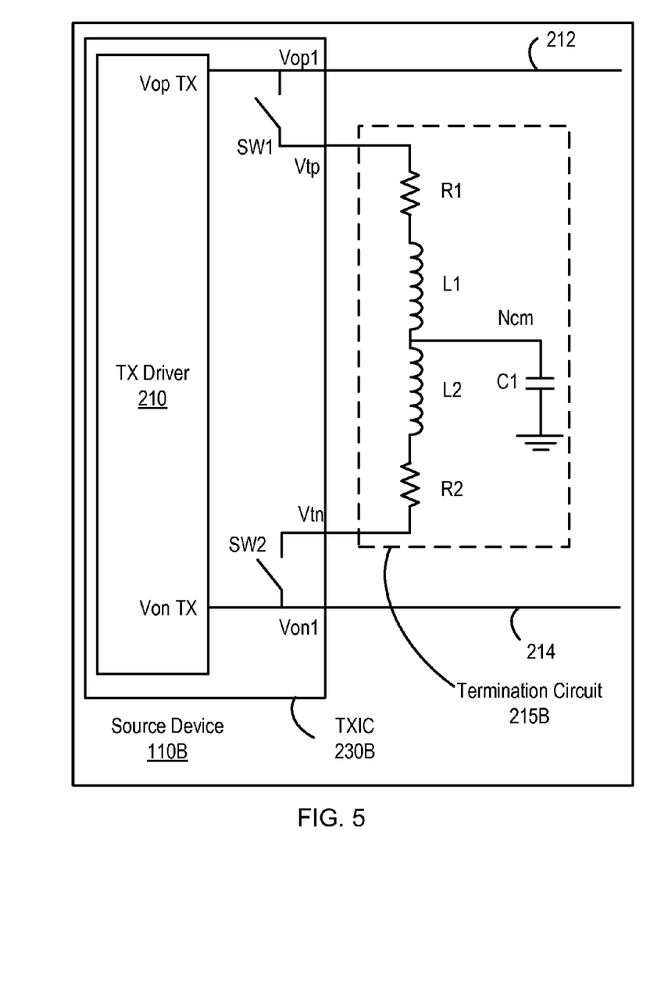
FIG. 5 is an illustration of a block diagram of a source device with a transmitter integrated circuit (IC) including switches for enabling the termination, according to one embodiment.

Referring to FIG. 5, illustrated is a block diagram of the source device 110B with a TXIC 230B including a first switch SW1 and a second switch SW2 for enabling the termination, according to one embodiment. The source device 110B is configured similar to the source device 110A of FIG. 2A. Also, the termination circuit 215B of the source device 110B is similar to the termination circuit 215A of the source device 110A. The differences include the first switch SW1 and the second switch SW2 being embedded in the TXIC 230B. The first switch SW1 and the second switch SW2 enable a connection between the differential output pins Vop1 and Vop2, and the termination circuit 215B.

In the TXIC 230B, the first switch SW1, the first resistor R1 and the first inductor L1 are coupled in series between the positive output pin Vop1 of the TXIC 230B and the common node Ncm. In one embodiment, one end of the first switch SW1 is coupled in series to the first resistor R1 and the first inductor L1 through a first termination pin Vtp of the TXIC 230B. Additionally, another end of the first switch SW1 is coupled to the positive output pin Vop1 of the TXIC 230B. Additionally, the second switch SW2, the second resistor R2 and the second inductor L2 are coupled in series between the negative output pin Von1 of the TXIC 230B and the common node Ncm. In addition, one end of the second switch SW2 is coupled to the second resistor R2 and the second inductor L2 through a second termination pin Vtn of the TXIC 230B. Moreover, another end of the second switch SW2 is coupled to the negative output pin Von1 of the TXIC 230B.

Figure 6:
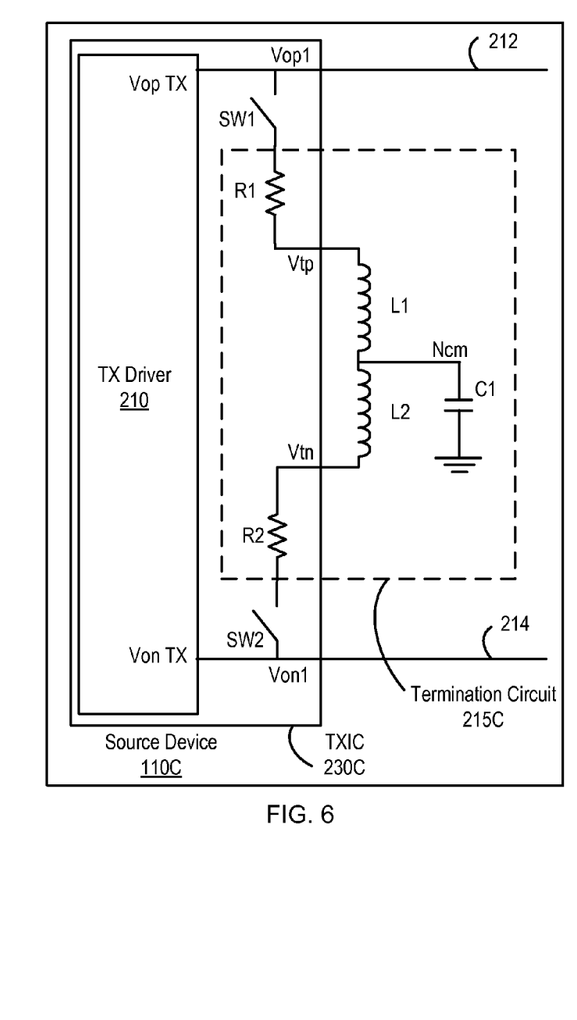
FIG. 6 is an illustration of a block diagram of a source device with a transmitter IC including switches and resistors, according to one embodiment.

FIG. 6 is an illustration of a block diagram of a source device 110C with a TXIC 230C including the first switch SW1, the second switch SW2, the first resistor R1 and the second resistor R2, according to one embodiment. The source device 110C is configured similar to the source device 110B of FIG. 5. The differences include the first resistor R1 and the second resistor R2 being embedded in the TXIC 230C. As a result, off-chip components of the termination circuit 215C include the first inductor L1, the second inductor L2 and the capacitor C1. The source device 110C saves area used for implementing the first resistor R1 and the second resistor R2 off-chip.

In the TXIC 230C, the first switch SW1 and the first resistor R1 are coupled in series to the first inductor L1 through a first termination pin Vtp of the TXIC 230C. For example, one end of the first switch SW1 is coupled to a positive output pin Vop1 and another end of the first switch SW1 is coupled to one end of the first resistor R1. Additionally, another end of the first resistor R1 is coupled to the first termination pin Vtp of the TXIC 230C. Alternatively, the first switch SW1 and the first resistor R1 may be swapped. In addition, the second switch SW2 and the second resistor R2 are coupled in series to the second inductor L2 through a second termination pin Vtn of the TXIC 230C. The configuration of the second switch SW2, the second resistor R2, the negative output pin Von1 and the second termination pin Vtn of the TXIC 230C are similar to the configuration of the first switch SW1, the first resistor R1, the positive output pin Vop1 and the first termination pin Vtp of the TXIC 230C.

Figure 7:
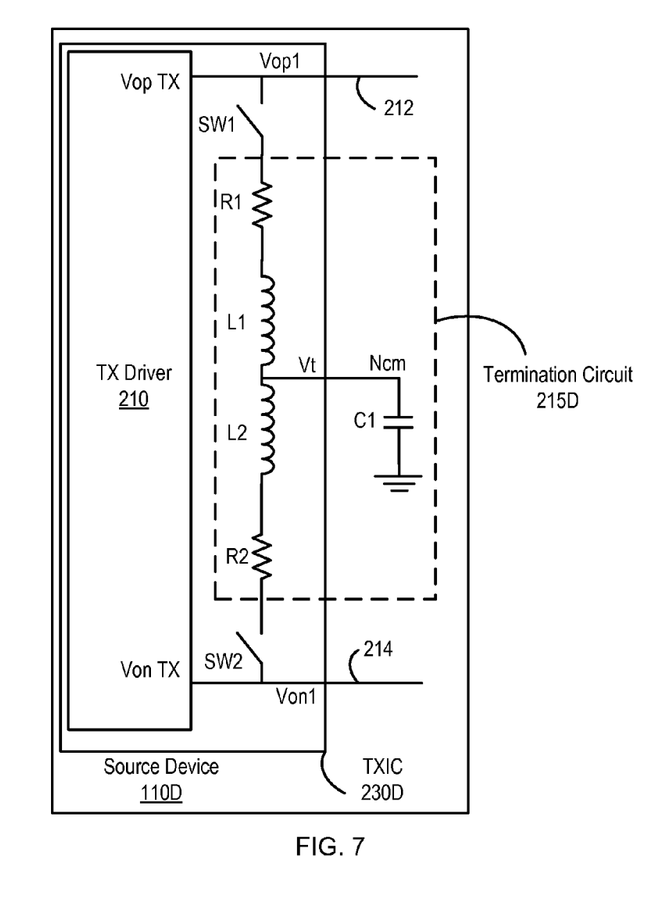
FIG. 7 is an illustration of a block diagram of a source device with a transmitter IC including switches, resistors and inductors, according to one embodiment.

Turning to FIG. 7, illustrated is a block diagram of a source device 110D with a TXIC 230D including the first switch SW1, the second switch SW2, the first resistor R1, the second resistor R2, the first inductor L1 and the second inductor L2, according to one embodiment. The source device 110D is configured similar to the source device 110C of FIG. 6. The differences include the first inductor L1 and the second inductor L2 being embedded in the TXIC 230D. As a result, an off-chip component of the termination circuit 215D includes the capacitor C1. The source device 110D saves area used for implementing the first inductor L1 and the second inductor L2 off-chip. The first inductor L1 and the second inductor L2 may be implemented with on-chip spiral inductors or bonding wires that are lengthened until they have a substantial amount of inductance.

In the TXIC 230D, the first switch SW1, the first resistor R1, and the first inductor L1 are coupled in series to the common node Ncm through a termination pin Vt of the TXIC 230D. For example, one end of the first switch SW1 is coupled to a positive output pin Vop1 and another end of the first switch SW1 is coupled to one end of the first resistor R1. Additionally, another end of the first resistor R1 is couple to one end of an inductor L1, and another end of the inductor L1 is coupled to the termination pin Vt of the TXIC 230D. Alternatively, the first switch SW1, the first resistor R1, and the first inductor L1 may be swapped. In addition, the second switch SW2, the second resistor R2, and the second inductor L2 are coupled in series to the common node Ncm through the termination pin Vp of the TXIC 230D. The configuration of the second switch SW2, the second resistor R2, the second inductor L2, and the negative output pin Von1 of the TXIC 230D are similar to the configuration of the first switch SW1, the first resistor R1, the first inductor L1, and the positive output pin Vop1 of the TXIC 230D.

Figure 8:
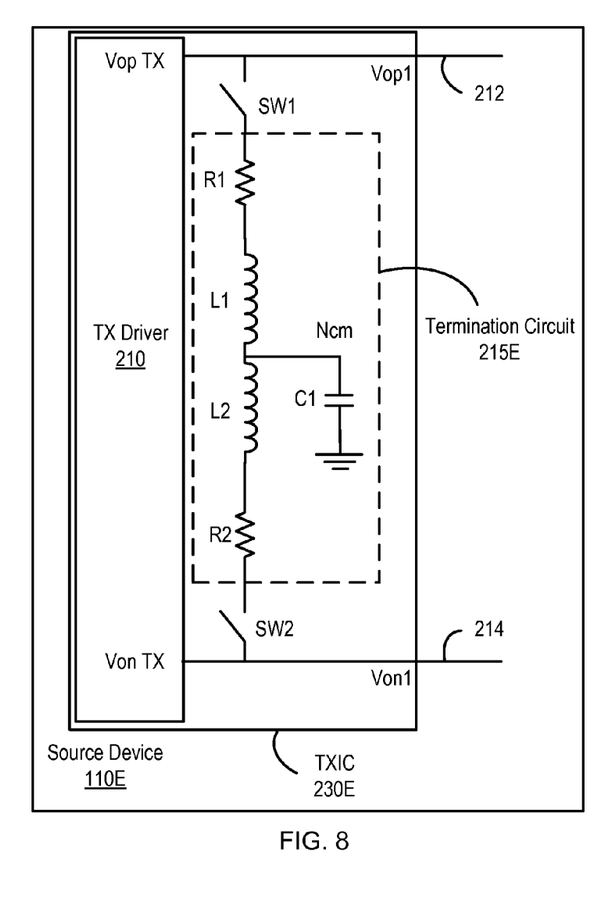
FIG. 8 is an illustration of a block diagram of a source device with a transmitter IC including switches, resistors, inductors, and a capacitor, according to one embodiment.

FIG. 8 is an illustration of a block diagram of a source device 110E with a TXIC 230E including all passive components of the termination circuit 215E, according to one embodiment. The source device 110E is configured similar to the source device 110D of FIG. 7. The differences include the capacitor C1 embedded in the TXIC 230E. Hence, the termination pin Vt of TXIC 230D of FIG. 7 is omitted. The source device 110E saves area used for implementing the capacitor C1 off-chip, and additional termination pins employed in the TXIC 230B-D.

Figure 9:
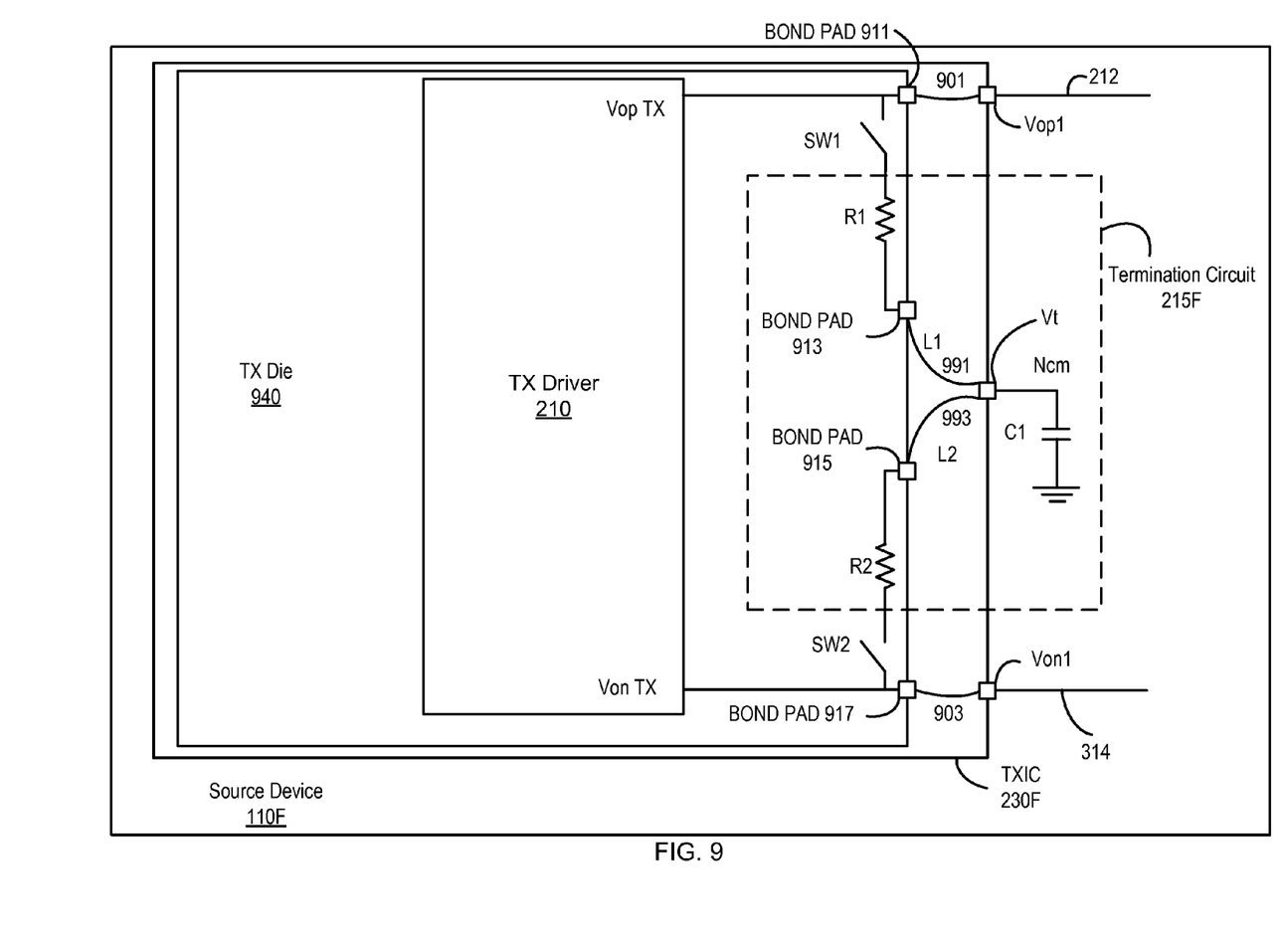
FIG. 9 is an illustration of a block diagram of a source device with a transmitter IC including switches, resistors, and bonding inductors, according to one embodiment.

FIG. 9 is an illustration of a source device 110F, according to one embodiment. The source device 110F illustrated in FIG. 9 is a detailed implementation of the source device 110D of FIG. 7 that includes connections to a transmitter die 940 and a package of the TXIC 230F. The transmitter die 940 is a silicon wafer with core circuitries implemented on the transmitter die 940. The connections between the transmitter die 940 and the package of the TXIC 230F may be implemented with bonding wires.

The transmitter die 940 includes the TX driver 210 implemented on any fabrication process or technologies. The transmitter die 940 also includes the first switch SW1, the second switch SW2, the first resistor R1 and the second resistor R2. The positive output pin Vop TX of the TX driver 210 is coupled to a bond pad 911, and the negative output pin Von TX of the TX driver 210 is coupled to a bond pad 917. The transmitter die 940 also includes the first switch SW1 and the first resistor R1 coupled to the positive output pin Vop TX of the TX driver 210. Additionally, the transmitter die 940 includes the second switch SW2 and the second resistor R2 coupled to the negative output pin Von TX of the TX driver 210.

A bond pad 913 allows the first switch SW1 and the first resistor R1 to be coupled to a termination pin Vt of the TXIC 230F through a lengthened bonding wire 991 serving as the first inductor L1. In addition, a bond pad 915 allows the second switch SW2 and the second resistor R2 to be coupled to the termination pin Vt of the TXIC 230F through a lengthened bonding wire 993 serving as the second inductor L2. The bonding wires 991 and 993 are lengthened such that they have a substantial amount of inductance (e.g., >1.5 nH) in accordance with the equation for inductance described above.

Similarly, a bond pad 911 allows the positive output pin Vop TX of the TX driver 210 to be coupled to the positive output pin Vop1 of the TXIC 230F through a short bonding wire 901 having substantially no inductance. In addition, the bond pad 917 allows the negative output pin Von TX of the TX driver 210 to be coupled to the negative output pin Von1 of the TXIC 230F through a short bonding wire 903 having substantially no inductance.

In this embodiment, the termination circuit 215F employs the capacitor C1 as an external component. The capacitor C1 is coupled between the common node Ncm and ground. The common node Ncm is coupled to the first inductor L1 and the second inductor L2 through a termination pin Vt of the TXIC 230F.

Beneficially, the disclosed configuration provides an optimal termination of an output of the transmitter while decreasing EMI and maintaining signal quality.

Upon reading this disclosure, those of skill in the art will appreciate still additional alternative designs for an apparatus with improved source termination. Thus, while particular embodiments and applications of the present disclosure have been illustrated and described, it is to be understood that the embodiments are not limited to the precise construction and components disclosed herein and that various modifications, changes and variations which will be apparent to those skilled in the art may be made in the arrangement, operation and details of the method and apparatus of the present disclosure disclosed herein without departing from the spirit and scope of the disclosure as defined in the appended claims.

What is claimed is:
1. A transmitting apparatus comprising:
a transmitter driver to generate a differential mode signal superimposed on a common mode signal at a differential driver output of the transmitter driver, the differential driver output including a first driver output and a second driver output;
a common mode choke to suppress common mode noise at the differential driver output; and
a termination circuit at the differential driver output and being separate from the transmitter driver, the termi- nation circuit coupled between the first driver output and the second driver output, the termination circuit comprising:
a capacitor connected to a node;
a first series circuit comprising a first resistor and a first inductive element coupled in series, one end of the first series circuit coupled to the node; and
a second series circuit comprising a second resistor and a second inductive element coupled in series, one end of the second series circuit coupled to the node, the first driver output connected to a first input of the common mode choke and another end of the first series circuit, while the second driver output is connected to a second input of the common mode choke and another end of the second series circuit, the first inductive element and the second inductive element causing peaking in the differential mode signal at the differential driver output,
wherein the first inductive element has an inductance L, the first resistor has a resistance R, and the common mode signal has a frequency fcm, wherein the inductance L, the resistance R and the frequency fcm satisfy the following equation:

$$L < \frac{R}{2 \times \pi \times fcm \times 3}.$$

2. The transmitting apparatus of claim 1, wherein the differential mode signal and the common mode signal operate at different frequencies.

3. The transmitting apparatus of claim 2, further comprising:
a first switch separate from the transmitter driver and coupled in series with the first resistor and the first inductive element between the first driver output and the node; and
a second switch separate from the transmitter driver and coupled in series with the second resistor and the second inductive element between the second driver output and the node.

4. The transmitting apparatus of claim 3, wherein the first switch and second switch are closed when the apparatus is communicating through a first communication protocol, and the first switch and the second switch are open when the apparatus is communicating through a second communication protocol.

5. The transmitting apparatus of claim 3, wherein the first switch and the second switch are on an integrated circuit with the transmitter driver.

6. The transmitting apparatus of claim 2, wherein the first inductive element and the second inductive element are on a printed circuit board.

7. The transmitting apparatus of claim 2, wherein the first inductive element and the second inductive element are on an integrated circuit with the transmitter driver.

8. The transmitting apparatus of claim 7, wherein the first inductive element and the second inductive element are bonding wires.

9. The transmitting apparatus of claim 2, wherein the first resistor and the second resistor are on a printed circuit board.

10. The transmitting apparatus of claim 2, wherein the first resistor and the second resistor are on an integrated circuit with the transmitter driver.

11. The transmitting apparatus of claim 2, wherein the capacitor is on a printed circuit board.

12. The transmitting apparatus of claim 2, wherein the capacitor is on an integrated circuit with the transmitter driver.

13. The transmitting apparatus of claim 2, wherein the differential mode signal is a mobile high definition link signal.

14. The transmitting apparatus of claim 2, wherein the capacitor is connected between the node and ground.

15. The transmitting apparatus of claim 2, wherein the first inductive element and the second inductive element have impedances at a frequency of the differential mode signal that causes the peaking, and the first inductive element and the second inductive element have substantially no impedance at a frequency of the common mode signal.

16. An apparatus comprising:
a driver to generate a differential mode signal superimposed on a common mode signal at a differential driver output of the driver, the differential driver output including a first driver output and a second driver output; and
a termination circuit coupled between the first driver output and the second driver output, the termination circuit comprising:
a capacitor connected to a node;
a first resistor and a first inductive element coupled in series between the first driver output and the node; and
a second resistor and a second inductive element coupled in series between the second driver output and the node, the first inductive element and the second inductive element causing peaking in the differential mode signal at the differential driver outputwherein the first inductive element has an inductance substantially equal to $$L = \frac{1}{4 \times \pi \times fx} \sqrt{\frac{x^2(150)^2 - (100)^2}{1 - x^2}},$$

where an insertion loss of a channel without the termination circuit is substantially equal to an insertion loss of the termination circuit at a frequency fx, and x is an insertion loss of the termination circuit at the frequency fx, wherein the channel comprises a connection to a port coupled to the first driver output and the second driver output.

17. The apparatus of claim 16, wherein a combined loss of the insertion loss of the channel and the insertion loss of the termination circuit is between −3 dB and −4 dB at the frequency fx.

18. The transmitting apparatus of claim 1, wherein the first inductive element and the second inductive element have impedances at a frequency of the differential mode signal that causes the peaking, and the first inductive element and the second inductive element have substantially no impedance at a frequency of the common mode signal.

* * * * *